United States Patent
Fukasawa

(10) Patent No.: US 9,530,725 B2
(45) Date of Patent: Dec. 27, 2016

(54) WIRING SUBSTRATE AND SEMICONDUCTOR PACKAGE

(71) Applicant: SHINKO ELECTRIC INDUSTRIES CO., LTD., Nagano-shi, Nagano (JP)

(72) Inventor: Ryo Fukasawa, Nagano (JP)

(73) Assignee: SHINKO ELECTRIC INDUSTRIES CO., LTD., Nagano-Shi (JP)

( * ) Notice: Subject to any disclaimer, the term of this patent is extended or adjusted under 35 U.S.C. 154(b) by 0 days.

(21) Appl. No.: 15/056,047

(22) Filed: Feb. 29, 2016

(65) Prior Publication Data

US 2016/0260661 A1    Sep. 8, 2016

(30) Foreign Application Priority Data

Mar. 2, 2015  (JP) .................... 2015-040367

(51) Int. Cl.
- *H01L 23/48* (2006.01)
- *H01L 23/498* (2006.01)
- *H01L 23/12* (2006.01)

(52) U.S. Cl.
CPC ......... *H01L 23/49838* (2013.01); *H01L 23/12* (2013.01); *H01L 23/49822* (2013.01); *H01L 23/49827* (2013.01)

(58) Field of Classification Search
CPC ............. H01L 23/498; H01L 23/49827; H01L 23/49833; H01L 23/49838

USPC ......................................................... 257/773
See application file for complete search history.

(56) References Cited

U.S. PATENT DOCUMENTS

| 8,138,609 B2 * | 3/2012 | Horiuchi | ............... H01L 21/561 257/773 |
| 2014/0117539 A1 * | 5/2014 | Karasawa | ............... H01L 23/15 257/737 |

FOREIGN PATENT DOCUMENTS

JP          2011-171531          9/2011

* cited by examiner

*Primary Examiner* — Cuong Q Nguyen
(74) *Attorney, Agent, or Firm* — Rankin, Hill & Clark LLP

(57) ABSTRACT

A wiring substrate includes a core layer including a plate-like body and linear conductors, a first wiring layer formed on a first surface of the plate-like body, and an insulating layer formed on the first surface. A gap between the adjacent linear conductors is smaller than a diameter of each linear conductor. The linear conductors include a first linear conductor disposed in a position overlapping with the first wiring layer and conducting to the first wiring layer and a second linear conductor disposed in a position not overlapping with the first wiring layer. An end surface of the first linear conductor on the side of the first surface is approximately flush with the first surface. An end surface of the second linear conductor on the side of the first surface is in a position more depressed than the first surface to form a hole. The insulating layer is filled in the hole.

5 Claims, 9 Drawing Sheets

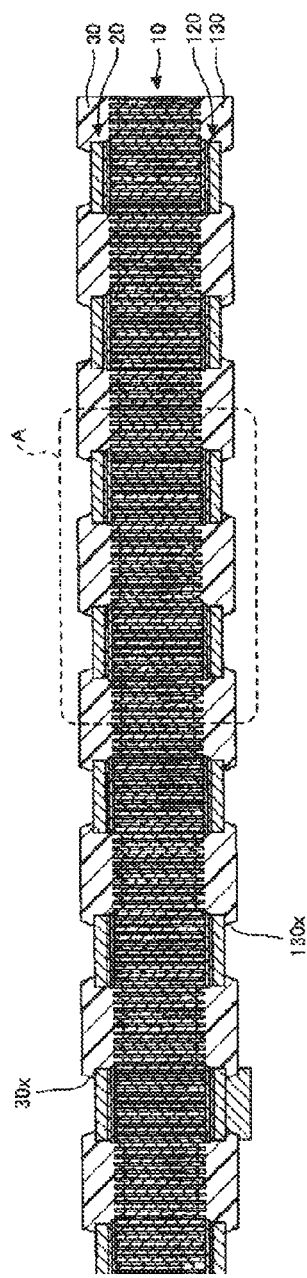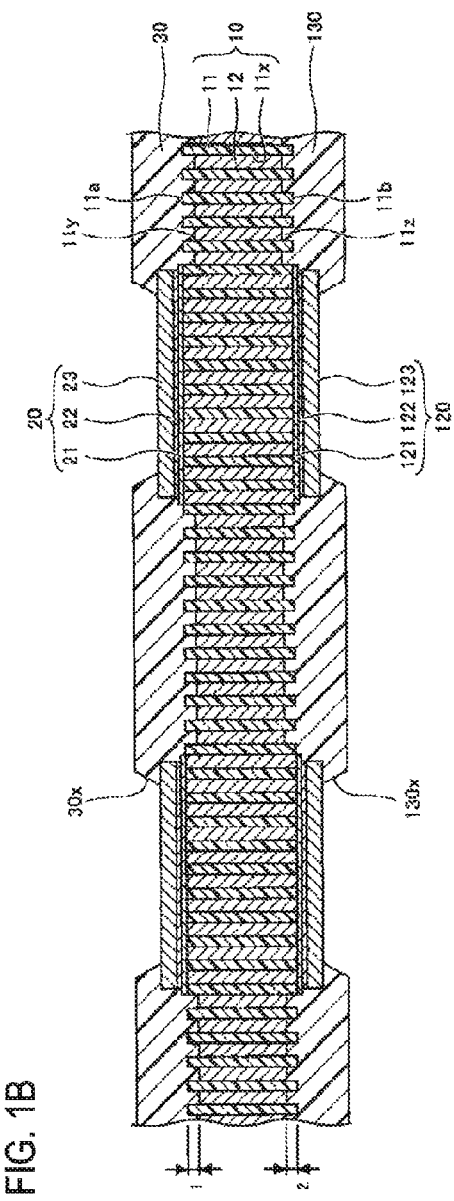

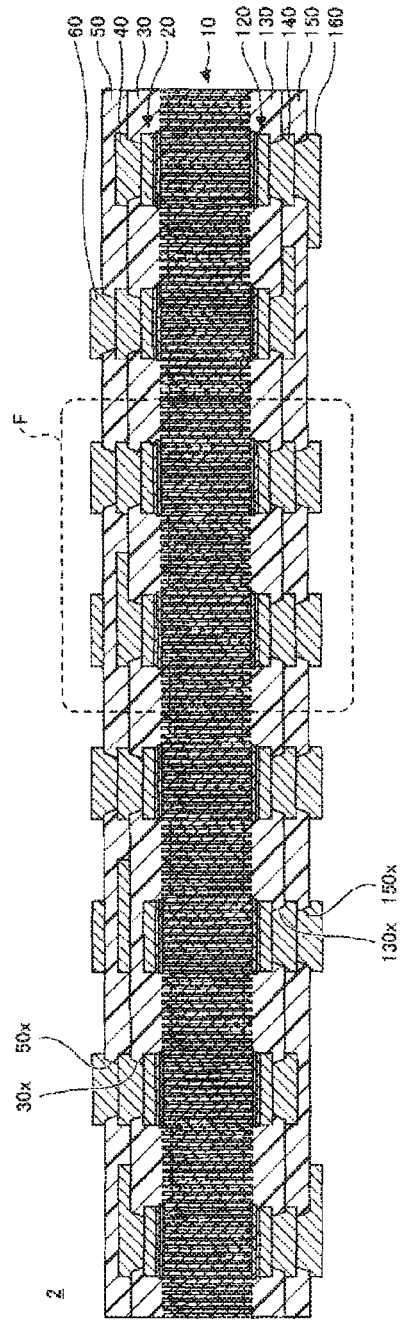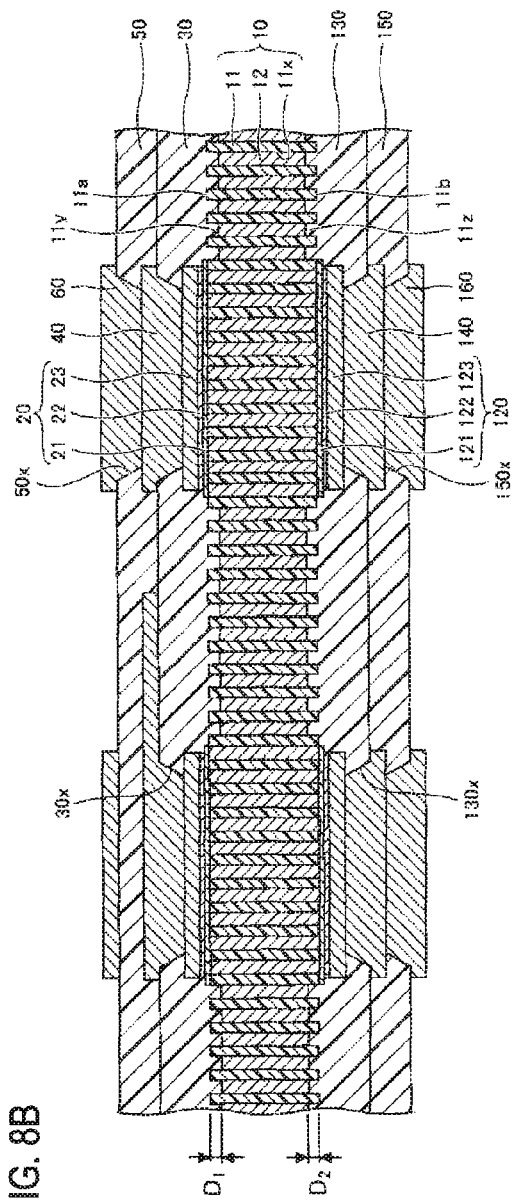
FIG. 8A
FIG. 8B

WIRING SUBSTRATE AND SEMICONDUCTOR PACKAGE

CROSS-REFERENCE TO RELATED APPLICATION

The present application claims priority from Japanese Patent Application No. 2015-040367 filed on Mar. 2, 2015, the entire content of which is incorporated herein by reference.

BACKGROUND

Technical Field

The present invention relates to a wiring substrate and a method for manufacturing the same, and a semiconductor package.

Related Art

There is known a wiring substrate having a core layer provided with an insulating base material and plural linear conductors penetrating from one surface to the other surface of the insulating base material, in which a wiring layer is formed on both surfaces of the core layer. In this wiring substrate, the wiring layers which are disposed in a position facing each other across the core layer are electrically connected to each other by the linear conductors in the core layer. In addition, the wiring layer formed on each of the both surfaces of the core layer is covered by an insulating layer.

[Patent Document 1] Japanese Patent Application Publication No. 2011-171531A

However, since the above-described wiring substrate is provided with the linear conductors over the entirety of the insulating base material, in a portion where the wiring layer does not exist, an upper end surface and an lower end surface of the linear conductor are exposed in a position approximately flush with the one surface and the other surface of the insulating base material, respectively. The linear conductor exposing in a portion where the wiring layer does not exist electrically float, and the end surfaces are exposed, and therefore, there was involved such a problem that insulation reliability between the wiring layers is lowered.

In addition, there is proposed a wiring substrate in which in the entirety of one surface and the other surface of an insulating base material, an upper end surface and a lower end surface of a linear conductor are depressed relative to the one surface and the other surface of the insulating base material, respectively to form concaves and convexes, and an insulating layer is filled in the concave and convex portions. In this wiring substrate, since the upper end surface and the lower end surface of the linear conductor are exposed in a position more depressed than the one surface and the other surface of the insulating base material, respectively, its insulating reliability is enhanced as compared with the above-described wiring substrate. However, since the wiring layer is formed in the concave and convex portions of the core layer, there was involved such a problem that connection reliability between the wiring layer and the linear conductor is lowered.

SUMMARY

Exemplary embodiments of the invention provide a wiring substrate with enhanced insulation reliability and connection reliability.

A wiring substrate according to an exemplary embodiment of the invention, comprises:

a core layer including a plate-like body and a plurality of linear conductors penetrating through the plate-like body in a thickness direction;

a first wiring layer formed selectively on a first surface of the plate-like body; and an insulating layer formed on the first surface and covering the first wiring layer, wherein a gap between the adjacent linear conductors is smaller than a diameter of each of the linear conductors, the plurality of linear conductors include a first linear conductor disposed in a position overlapping with the first wiring layer in planar view and conducting to the first wiring layer and a second linear conductor disposed in a position not overlapping with the first wiring layer in planar view, an end surface of the first linear conductor on the side of the first surface is approximately flush with the first surface, an end surface of the second linear conductor on the side of the first surface is in a position more depressed than the first surface, and a hole is formed between the end surface of the second linear conductor on the side of the first surface and the first surface, and the insulating layer is filled in the hole.

According to the disclosed technique, it is possible to provide a wiring substrate with enhanced insulation reliability and connection reliability.

BRIEF DESCRIPTION OF THE DRAWINGS

FIGS. 1A to 1B are cross-sectional views illustrating a wiring substrate according to a first embodiment of the present invention.

FIGS. 8A to 8B are cross-sectional views illustrating a wiring substrate according to a modified example of the first embodiment of the present invention.

DETAILED DESCRIPTION

Figure 2A:
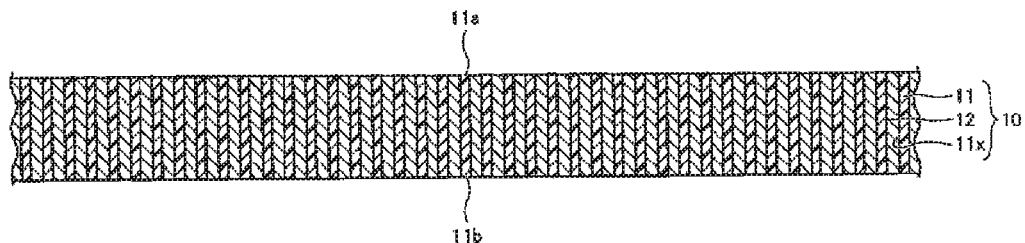
FIGS. 2A to 2D are views illustrating processes for manufacturing the wiring substrate according to the first embodiment of the present invention (part 1).

Embodiments for carrying out the present invention are hereunder described by reference to the accompanying drawings. It is to be noted that in the respective drawings, the same constituent portions are designated with the same symbols, and there may be the case where redundant explanations are omitted.

First Embodiment

Structure of Wiring Substrate According to First Embodiment of the Present Invention First of all, a structure of a wiring substrate according to a first embodiment of the present invention is described.

FIGS. 1A to 1B are cross-sectional views illustrating a wiring substrate according to the first embodiment, in which FIG. 1B is an enlarged view of a part A of FIG. 1A.

Reference is made to FIGS. 1A to 1B. A wiring substrate 1 has a core layer 10, a wiring layer 20, an insulating layer 30, a wiring layer 120, and an insulating layer 130.

It is to be noted that in the present embodiment, for the sake of convenience, the side of the insulating layer 30 of the wiring substrate 1 is referred as the upper side or one side, and the side of the insulating layer 130 is referred as the lower side or the other side. In addition, the surface of the side of the insulating layer 30 of each site is referred as one surface or an upper surface, and the surface of the side of the insulating layer 130 is referred as the other surface or the lower surface. However, the wiring substrate 1 may be used in a top/bottom reversed state, or it may be disposed at an arbitrary angle. In addition, the planar view refers to the matter that an object is viewed from a normal direction of one surface 11a of a plate-like body 11 (as described later), and the planar shape refers to a shape in which the object is viewed from the normal direction of the one surface 11a of the plate-like body 11.

The core layer 10 is a flat plate member serving as a base material for forming the wiring layer 20 and the like. The planar shape of the core layer 10 may be, for example, formed in a rectangular shape of about 200 mm×200 mm. A thickness of the core layer 10 may be, for example, about 70 to 100 μm. However, the planar shape of the core layer 10 is not limited to the rectangular shape, and it may also be, for example, a circular shape or the like.

The core layer 10 is provided with the plate-like body 11 made of aluminum oxide and plural linear conductors 12 penetrating through the plate-like body 11 in a thickness direction. The linear conductors 12 are a portion formed by filling a metal material in a large number of through-holes 11x penetrating through the entirety of the plate-like body 11 in the thickness direction.

It is to be noted that the plate-like body 11 may also be formed of other material than aluminum oxide, such as silicon oxide, mullite, aluminum nitride, glass ceramics (composite material of glass and ceramics), barium strontium titanate, barium titanate, strontium titanate, or titanium zirconium.

It is preferred that the linear conductors 12 are densely formed to such extent that a gap between the adjacent linear conductors 12 is smaller than a diameter of the linear conductor 12. The linear conductors 12 may be, for example, formed in a density of $4\times10^6$ conductors per $mm^2$ or more and $1\times10^{10}$ conductors per $mm^2$ or less. However, the disposition form of the linear conductors 12 is not particularly limited, and for example, the linear conductor 12 may be disposed in a hexagonal state or may be disposed in a grid state. As the metal material capable of forming the linear conductor 12, for example, copper (Cu), silver (Ag), nickel (Ni), or the like may be used.

In the linear conductor 12, its upper end surface is exposed from the one surface 11a of the plate-like body 11, and its lower end surface is exposed from the other surface 11b of the plate-like body 11. The respective linear conductors 12 are formed approximately parallel to each other at approximately fixed intervals over the approximately entire surface of the plate-like body 11. The linear conductor 12 may be, for example, formed in a circular shape in planar view, and its diameter may be, for example, about 50 nm to 2 μm. However, it should be construed that the "circular shape in planar view" as referred to herein includes not only the case of a strictly circular shape but also the case of an approximately circular shape.

In a region where the wiring layer 20 of the one surface 11a of the plate-like body 11 is formed, the upper end surface of the linear conductor 12 is flush with the one surface 11a. Namely, the end surface of the linear conductor 12 that is disposed in a position overlapping with the wiring layer 20 in planar view and conducts to the Airing layer 20 (hereinafter sometimes referred to as "first linear conductor") on the side of the one surface 11a is flush with the one surface 11a.

The term "flush" as referred to herein refers to the matter that the one surface 11a is not subjected to a treatment, such as etching of the upper end surface of the linear conductor 12 to depress it, and the one surface 11a and the upper end surface of the linear conductor 12 are approximately flush with each other. In consequence, it should be construed that even if concaves and convexes microscopically exist as shown in a part C in FIG. 4(C) as described later, so long as those concaves and convexes are not intentionally fabricated, such a case is included in the scope of the term "flush" (the same as in the case of the other surface 11b and the lower end surface of the linear conductor 12).

Meanwhile, in a region where the wiring layer 20 of the one surface 11a of the plate-like body 11 is not formed (a region between the wiring layers 20), the upper end surface of the linear conductor 12 exists in a position more depressed than the one surface 11a. Namely, the end surface of the linear conductor 12 that is disposed in a position not overlapping with the wiring layer 20 in planar view (hereinafter sometimes referred to as "second linear conductors") on the side of the one surface 11a exists in a position more depressed than the one surface 11a. A depression amount $D_1$ (depth) of the upper end surface of the linear conductor 12 relative to the one surface 11a may be, for example, about several ten nm to several μm. A hole 11y is formed by an inner wall surface of the through-hole 11x and the upper end surface of the linear conductor 12, and the insulating layer 30 is filled in the hole 11y.

Similarly; in a region where the wiring layer 120 of the other surface 11b of the plate-like body 11 is formed, the lower end surface of the linear conductor 12 is approximately flush with the other surface 11b. Namely, the end surface of the linear conductor 12 that is disposed in a position overlapping with the wiring layer 120 in planar view and conducts to the wiring layer 120 on the side of the other surface 11b is flush with the other surface 11b.

Meanwhile, in a region where the wiring layer 120 of the other surface 11b of the plate-like body 11 is not formed (a region between the wiring layers 120), the lower end surface of the linear conductor 12 exists in a position more depressed than the other surface 11b. Namely, the end surface of the linear conductor 12 that is disposed in a position not overlapping with the wiring layer 120 in planar view on the side of the other surface 11b exists in a position more depressed than the other surface 11b. A depression amount $D_2$ (depth) of the lower end surface of the linear conductor 12 relative to the other surface 11b may be, for example, about several ten nm to several μm. A hole 11z is formed by an inner wall surface of the through-hole 11x and the lower end surface of the linear conductor 12, and the insulating layer 130 is filled in the hole 11z. The hole 11z is one of representative examples of a second hole according to the present invention.

The wiring layer 20 is formed selectively on the one surface 11a (first surface) of the plate-like body 11. The wiring layer 20 may be formed so as to have a structure in which a metal layer 21, a metal layer 22, and a metal layer 23 are successively provided from the side of the one surface 11a. In planar view, an outer peripheral part of the metal layer 21 is exposed to a region surrounding the metal layers 22 and 23. The metal layer 21 is one of representative examples of a lower metal layer according to the present invention, and the metal layers 22 and 23 are one of representative examples of an upper metal layer according to the present invention.

The wiring layer 120 is formed selectively on the other surface 11b (second surface) of the plate-like body 11. The wiring layer 120 may be formed so as to have a structure in which a metal layer 121, a metal layer 122, and a metal layer 123 are successively provided from the side of the other surface 11b. In planar view, an outer peripheral part of the metal layer 121 is exposed to a region surrounding the metal layers 122 and 123. The wiring layer 20 and the wiring layer 120 are disposed in a position approximately overlapping with each other in planar view and electrically connected to each other via the plural linear conductors 12. The wiring layer 120 is one of representative examples of a second wiring layer according to the present invention.

As a material of each of the metal layers 21 and 121, for example, titanium (Ti), titanium nitride (TiN), or the like may be used. A thickness of each of the metal layer 21 and 121 may be, for example, about 1 μm or less. As a material of each of the metal layers 22 and 122, for example, copper (Cu) or the like may be used. A thickness of each of the metal layers 22 and 122 may be, for example, about 1 μm or less. As a material of each of the metal layers 23 and 123, for example, copper (Cu) or the like may be used. A thickness of each of the metal layers 23 and 123 may be, for example, about several μm.

The insulating layer 30 is formed on the one surface 11a of the plate-like body 11 and covers the wiring layer 20. The insulating layer 30 has an opening 30x, and a part of an upper surface of the wiring layer 20 is exposed in the opening 30x. The insulating layer 130 is formed on the other surface 11b of the plate-like body 11 and covers the wiring layer 120. The insulating layer 130 has an opening 130x, and a part of a lower surface of the wiring layer 120 is exposed in the opening 130x. The insulting layer 130 is one of representative examples of a second insulating layer according to the present invention.

As a material of each of the insulating layers 30 and 130, for example, an insulating resin containing, as a main component, an epoxy-based resin or a phenol-based resin, or the like may be used. Each of the insulating layers 30 and 130 may contain a filler, such as silica ($SiO_2$). In addition, each of the insulating layers 30 and 130 may have thermosetting or photosensitive properties. A thickness of each of the insulating layers 30 and 130 may be, for example, about 3 to 30 μm. As described above, the insulating layer 30 fills the hole 11y, and the insulating layer 130 fills the hole 11z.

Each of the wiring layer 20 exposed in the opening 30x and the wiring layer 120 exposed in the opening 130x functions as a pad to be electrically connected to a semiconductor chip or the like. If desired, a metal layer may be formed on each of the upper surface of the wiring layer 20 exposed in the opening 30 and the lower surface of the wiring layer 120 exposed in the opening 130x. In addition, each of the wiring layer 20 and the wiring layer 120 may be subjected to an anti-oxidation treatment, such as an OSP (organic solderability preservative) treatment. It is to be noted that the surface-treated layer to be formed by the OSP treatment is an organic film made of an azole compound, an imidazole compound, or the like.

Examples of the metal layer may include an Au layer, an Ni/Au layer (a metal layer obtained by providing an Ni layer and an Au layer in this order), and an Ni/Pd/Au layer (a metal layer obtained by providing an Ni layer, a Pd layer, and an Au layer in this order). In addition, an external connection terminal, such as a solder ball, may be formed on the upper surface of the wiring layer 20 exposed in the opening 30x or the lower surface of the wiring layer 120 exposed in the opening 130.

Method for Manufacturing Wiring Substrate According to First Embodiment

Then, a method for manufacturing a wiring substrate according to the first embodiment is described. FIGS. 2A to 2D and FIGS. 3A to 3D are views illustrating processes for manufacturing a wiring substrate according to the first embodiment.

First of all, in a process shown in FIG. 2A, the core layer 10 provided with the plate-like body 11 made of aluminum oxide and the plural linear conductors 12 penetrating through the plate-like body 11 in the thickness direction is fabricated. Specifically, a flat plate made of aluminum (Al) is first prepared, and the plate-like body 11 made of aluminum oxide and having a large number of the through-holes 11x formed therein is formed from the prepared flat plate by an anodic oxidation process.

The through-hole 11x may be, for example, formed in a circular shape in planar view, and in that case, its diameter may be, for example, about 50 nm to 2 μm. In addition, it is preferred that the through-holes 11x are densely formed to such extent that a gap between the adjacent through-holes 11x is smaller than a diameter of the through-hole 11x. However, the disposition form of the through-holes 11x is not particularly limited, and for example, the through-holes 11x may be disposed in a hexagonal state or may be disposed in a grid state.

The anodic oxidation process is a process in which a flat plate made of aluminum (Al) is used as an anode and dipped in an electrolytic solution (suitably a sulfuric acid aqueous solution), and energization (impression with a pulse voltage) is performed while using an electrode to be disposed opposite thereto, such as platinum (Pt). According to this, it is possible to form the plate-like body 11 made of aluminum oxide having a large number of the through-holes 11x formed therein (anodically oxidized film of aluminum).

Thereafter, a metal material is filled in the through-holes 11x formed in the plate-like body 11 to form the linear conductors 12. According to this, the core layer 10 provided with the plate-like body 11 made of aluminum oxide and the plural linear conductors 12 penetrating through the plate-like body 11 in the thickness direction is fabricated. The linear conductors 12 may be, for example, formed by filling an electrically conductive paste, such as copper (Cu) or silver (Ag), by, for example, a plating process, a screen printing process, an inkjet process, or the like.

Furthermore, if desired, it is possible to expose the both end surfaces of the linear conductor 12 on the both surfaces of the plate-like body 11 by polishing the both surfaces of the plate-like body 11 by mechanical polishing, chemical mechanical polishing, or the like and then flattening. In this way, it is possible to fabricate the core layer 10 in which the minute-diameter linear conductors 12 penetrating through plate-like body 11 in the thickness direction are highly densely provided.

Figure 2B:
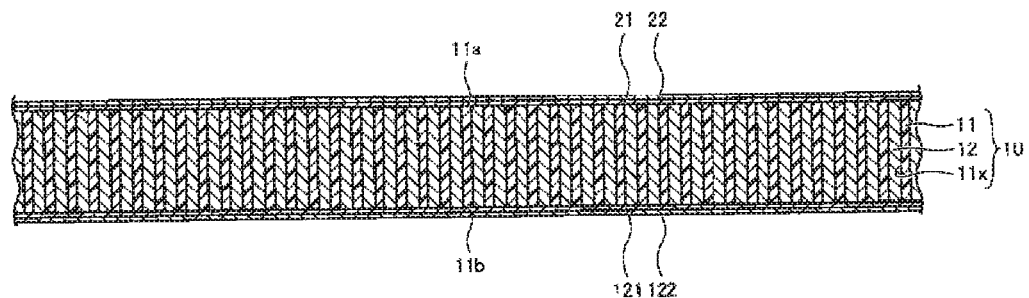

Then, in a process shown in FIG. 2B, the metal layers 21 and 22 are successively provided on the one surface 11a of the plate-like body 11 by, for example, a sputtering process. In addition, the metal layers 121 and 122 are successively provided on the other surface 11b of the plate-like body 11 by, for example, a sputtering process. The material and the thickness of each of the metal layers are those as described above. The metal layers 21 and 22 and the metal layers 121 and 122 are electrically connected to each other via the plural linear conductors 12. It is to be noted that the metal layers 21 and 121 function as a barrier layer for preventing the metal layers 23 and 123 and the linear conductors 12 from occurrence of mutual dispersion and also as an adhesion layer for increasing connection reliability between the metal layers 23 and 123 and the linear conductors 12, and the metal layers 22 and 122 function as a seed layer (power supply layer) on the occasion of forming the metal layers 23 and 123 by an electroplating process.

Figure 2C:
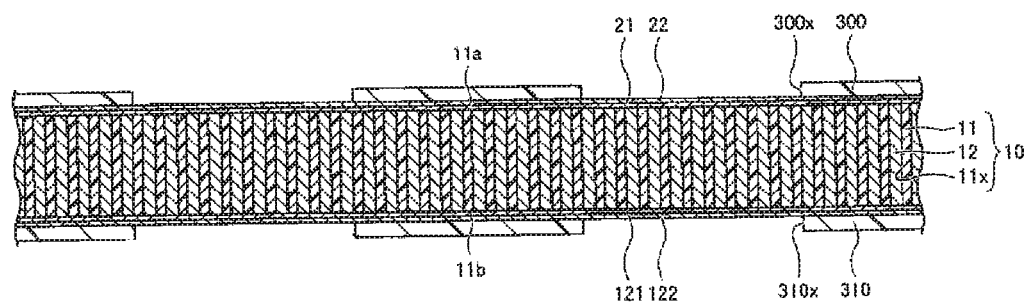

Then, in a process shown in FIG. 2C, a resist layer 300 provided with an opening 300x corresponding to the wiring layer 20 is formed on the metal layer 22. In addition, a resist layer 310 provided with an opening 310x corresponding to the wiring layer 120 is formed on the metal layer 122. The resist layers 300 and 310 may be, for example, formed by laminating a photosensitive dry film resist or the like on each of the surfaces. Each of the openings 300x and 310x may be formed by, for example, a photolithography process.

Figure 2D:
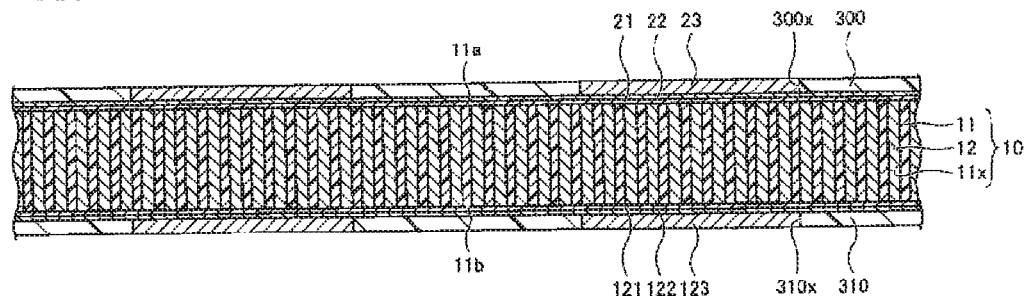

Then, in a process shown in FIG. 2D, the metal layer 23 made of copper (Cu) or the like as a plated layer is formed in the opening 300x of the resist layer 300 by an electroplating process using the metal layer 22 as a power supply layer. In addition, the metal layer 123 made of copper (Cu) or the like as a plated layer is formed in the opening 310x of the resist layer 310 by an electroplating process using the metal layer 122 as a power supply layer.

Figure 3A:
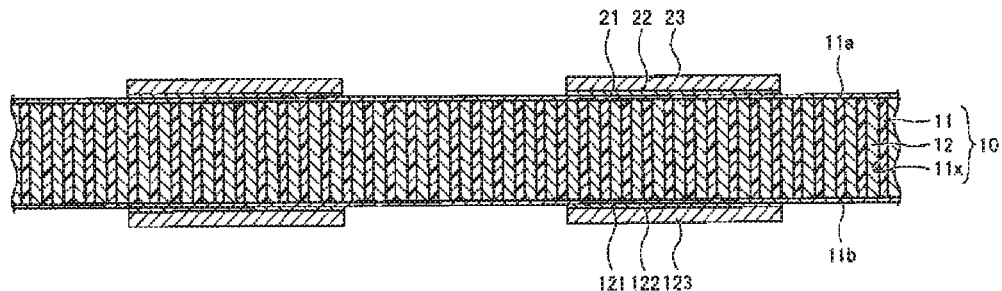
FIGS. 3A to 3D are views illustrating processes for manufacturing the wiring substrate according to the first embodiment of the present invention (part 2).

Then, in a process shown in FIG. 3A, after removing the resist layer 300 shown in FIG. 2D, the metal layer 23 is masked, and the metal layer 22 not covered by the metal layer 23 is removed by etching. In addition, after removing the resist layer 310 shown in FIG. 2D, the metal layer 123 is masked, and the metal layer 122 not covered by the metal layer 123 is removed by etching.

Figure 3B:
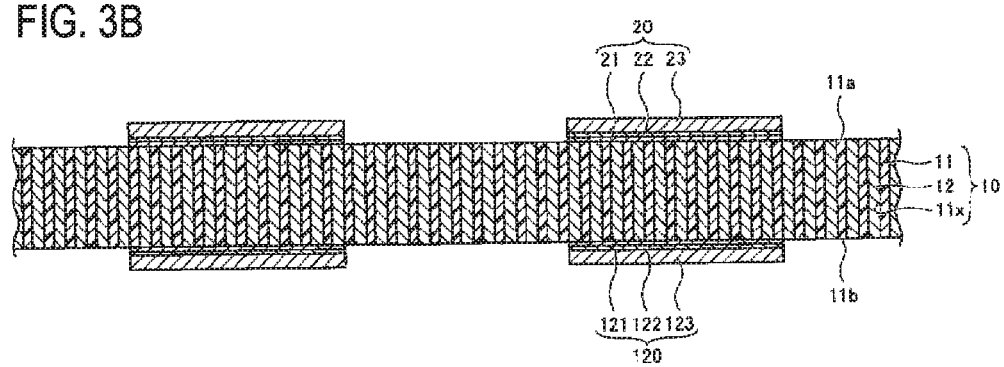

Then, in a process shown in FIG. 3B, the metal layer 23 is masked, and the metal layer 21 not covered by the metal layer 23 is removed by etching. In addition, the metal layer 123 is masked, and the metal layer 121 not covered by the metal layer 123 is removed by etching. According to this, the wiring layer 20 in which the metal layer 21, the metal layer 22, and the metal layer 23 are successively provided is selectively formed on the one surface 11a of the plate-like body 11. In addition, the wiring layer 120 in which the metal layer 121, the metal layer 122, and the metal layer 123 are successively provided is selectively formed on the other surface 11b of the plate-like body 11.

In the case where the metal layers 21 and 121 are each a layer containing titanium (Ti), the metal layers 21 and 121 may be removed by, for example, wet etching with hydrofluoric acid or the like.

Figure 3C:
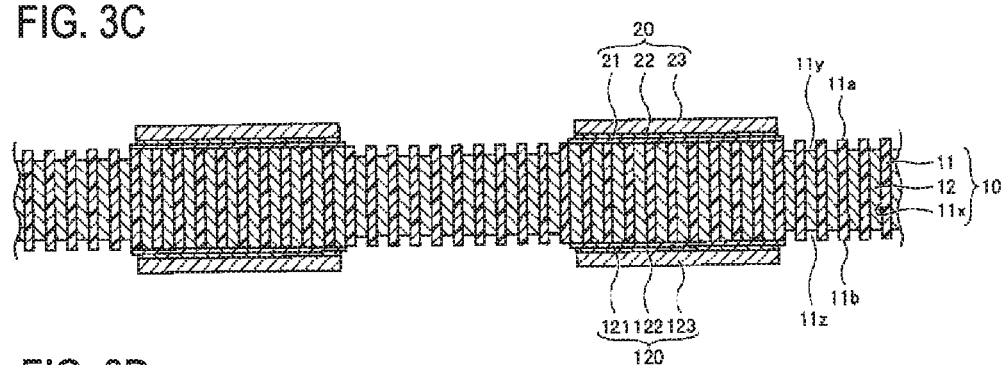

Then, in a process shown in FIG. 3C, the upper end surface of the linear conductor 12 disposed in a position not overlapping with the wiring layer 20 in planar view is made more depressed than the one surface 11a by selectively etching the plate-like body 11. In addition, the lower end surface of the linear conductor 12 disposed in a position not overlapping with the wiring layer 120 in planar view is made more depressed than the other surface 11b by selectively etching the plate-like body 11. It is to be noted that since each of the wiring layers 20 and 120 functions as a mask, the upper end surface of the linear conductor 12 disposed in a position overlapping with the wiring layer 20 in planar view and the lower end surface of the linear conductor 12 disposed in a position overlapping with the wiring layer 20 in planar view are not etched.

In the case where the linear conductor 12 is made of copper (Cu), the upper end surface and the lower end surface of the linear conductor 12 may be selectively etched with a mixed liquid of sulfuric acid and hydrogen peroxide water (sulfuric acid/hydrogen peroxide mixture) relative to the plate-like body 11 made of aluminum oxide. An etching amount of each of the upper end surface and the lower end surface of the linear conductor 12 may be, for example, about several ten nm to several μm. According to this, in a region not overlapping with the wiring layer 20 in planar view, the hole 11y is formed by an inner wall surface of the through-hole 11x and the upper end surface of the linear conductor 12. In addition, in a region not overlapping with the wiring layer 120 in planar view, the hole 11z is formed by an inner wall surface of the through-hole 11x and the lower end surface of the linear conductor 12.

It is to be noted that in the case where the linear conductor 12 is made of copper (Cu), and the layers 22 and 23 are also made of copper (Cu), the upper surfaces and the side surfaces of the metal layers 22 and 23 are etched to the same extent as in the upper end surface of the linear conductor 12; however, the metal layer 23 has a sufficient width or thickness, so that there is no problem. In this case, when the metal layer 21 is made of titanium (Ti) or titanium nitride (TiN), the metal layer 21 is not etched with an etchant of copper (Cu), and hence, an outer peripheral part of the metal layer 21 is exposed to a region surrounding the metal layers 22 and 23 in planar view.

Similarly, in the case where the linear conductor 12 is made of copper (Cu), and the layers 122 and 123 are also made of copper (Cu), the lower surfaces and the side surfaces of the metal layers 122 and 123 are etched to the same extent as in the lower end surface of the linear conductor 12; however, the metal layer 123 has a sufficient width or thickness, so that there is no problem. In this case, when the metal layer 121 is made of titanium (Ti) or titanium nitride (TiN), the metal layer 121 is not etched with an etchant of copper (Cu), and hence, an outer peripheral part of the metal layer 121 is exposed to a region surrounding the metal layers 122 and 123 in planar view.

Figure 3D:
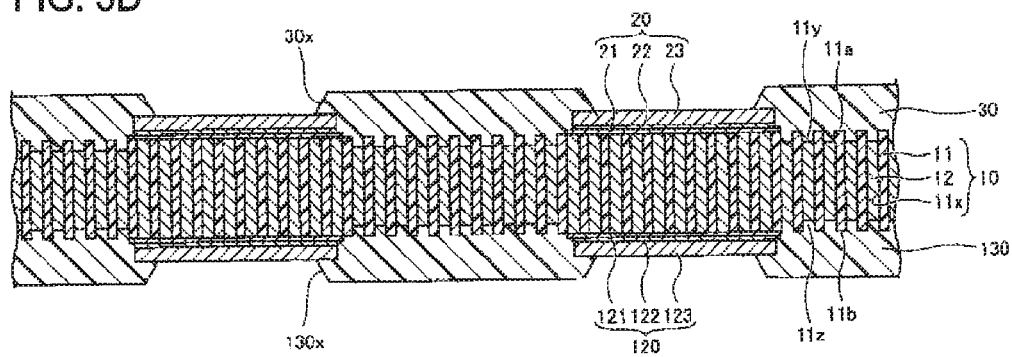

Then, in a process shown in FIG. 3D, not only the wiring layer 20 is covered on the one surface 11a of the plate-like body 11, but also the insulating layer 30 filled in the hole 11y is formed. The insulating layer 30 may be, for example, formed by applying a liquid or pasty photosensitive epoxy-based insulating resin on the one surface 11a of the plate-like body 11 so as to cover the wiring layer 20 by a screen printing process, a roll coating process, a spin coating process, or the like, followed by curing. Alternatively, the insulating layer 30 may also be, for example, formed by laminating a film-shaped photosensitive epoxy-based insulating resin on the one surface 11a of the plate-like body 11 so as to cover the wiring layer 20, followed by curing.

Similarly, not only the wiring layer 120 is covered on the other surface 11b of the plate-like body 11, but also the insulating layer 130 filled in the hole 11z is formed. It is to be noted that in view of the fact that the insulating layer 30 is filled in the hole 11y, and that the insulating layer 130 is filled in the hole 11z, an anchor effect is obtained, whereby adhesiveness between the core layer 10 and the insulating layers 30 and 130 is enhanced.

Thereafter, the applied or laminated insulating resin is exposed and developed to form the opening 30x in the insulating layer 30 (photolithography process). Similarly, the opening 130x is formed in the insulating layer 130 (photolithography process). It is to be noted that each of the openings 30x and 130x may also be formed by a laser processing process or a blast treatment. Alternatively, the insulating layers 30 and 130 in which the openings 30x and 130x have been previously formed, respectively may be laminated. The wiring substrate 1 shown in FIGS. 1A to 1B is accomplished according to the foregoing processes.

Here, peculiar effects to be brought by the wiring substrate 1 are described while referring to Comparative Examples.

Enhancement of Insulation Reliability

Figure 4A:
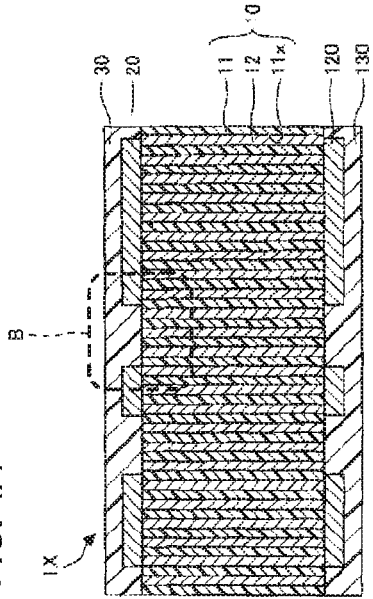
FIGS. 4A to 4D are views explaining insulation reliability of a wiring substrate according to Comparative Example.
Figure 4B:
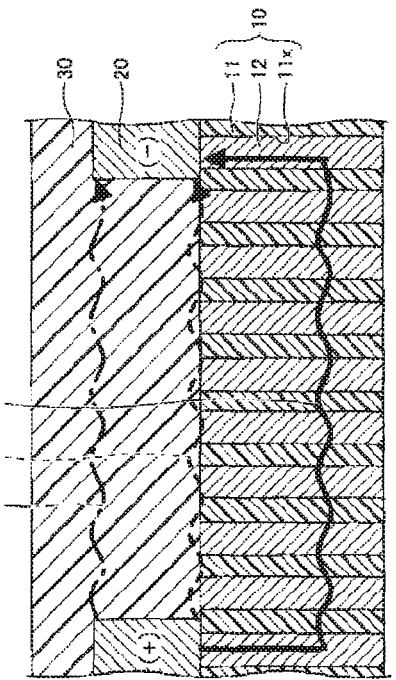
Figure 4C:
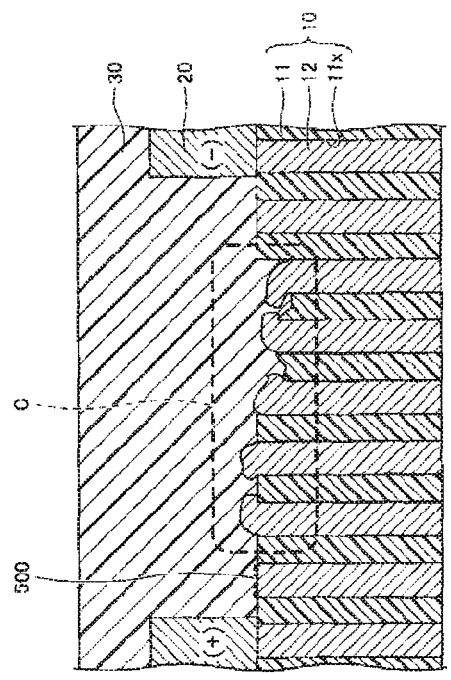
Figure 4D:
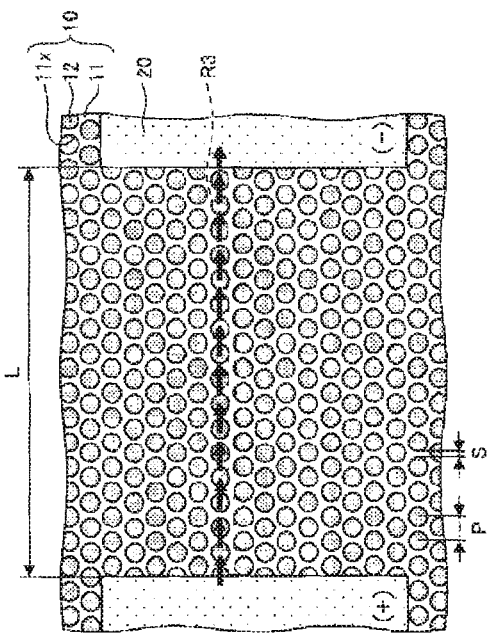

FIGS. 4A to 4D are views explaining the insulation reliability of a wiring substrate according to Comparative Example. FIG. 4A is a cross-sectional view illustrating a wiring substrate 1X according to Comparative Example, and FIGS. 4B and 4C are each an enlarged view of a part B of FIG. 4A. In addition. FIG. 4D is a plan view of the part B. However, in FIG. 4D, the insulating layer 30 is not illustrated.

Reference is made to FIGS. 4A and 4B. The wiring substrate 1X is different from the wiring substrate 1 (see FIGS. 1A to 1B) at the point that the upper end surface and the lower end surface of the linear conductor 12 existent in a region where the wiring layer 20 and 120 are not formed are approximately flush with the upper end surface and the lower end surface of the plate-like body 11, respectively. That is, in the wiring substrate 1X, the hole 11y and the hole 11z do not exist.

In general, a current flowing through an insulator (dielectric) includes a surface current relatively flowing on the surface and a volume current flowing within the insulator depending upon its route. In the wiring substrate 1X having a structure in which the plural linear conductors 12 are partitioned from each other by a partition wall of the plate-like body 11 as the insulator, three routes of R1, R2, and R3 shown in FIG. 4B may be thought as electron conducting routes causing insulation deterioration between the wiring layers 20.

In FIG. 4B, the route R1 is a route conducting within the insulating layer 30 on the wiring substrate 1X. The route R2 is a route conducting in the wiring substrate 1X (the linear conductors 12 and the partition wall of the plate-like body 11 partitioning the linear conductors 12 from each other). The route R3 is a route conducting on an interface between the plate-like body 11 and the insulating layer 30 (surface of the plate-like body 11). It is to be noted that (+) shows a high-potential side, and (−) shows a low-potential side.

Here, the route R1 conducts in only the insulator (insulating layer 30), whereas the route R2 and the route R3 conduct in the insulator (plate-like body 11) and the conductor (linear conductor 12). Namely, with respect to each of the route R2 and the route R3, since the linear conductor 12 exists on the route, a distance at which an electron conducts in or on the surface of the plate-like body 11 as the insulator is shorter than a distance at which an electron conducts in the insulating layer 30 as the insulator in the route R1.

For example, as shown in FIG. 4D, it is assumed that a gap L of the wiring layers 20 is 10 μm, a pitch P of the linear conductors 12 is 100 nm, and a thickness S of the partition wall of the plate-like body 11 (gap of the linear conductors 12) is 30 nm. In this case, the number of partition walls of the plate-like body 11 existing on the route R2 or R3 is 100 at minimum, and a substantial thickness of the insulator is {thickness S (=30 nm)×100=3 μm}.

Because the wiring substrate 1X is a composite of materials having different physical properties from each other, as in the linear conductor 12 and the plate-like body 11 as the insulator, it is difficult to obtain a uniform surface shape. For that reason, microscopically, as shown in a part C of FIG. 4C, defects (abnormal points) of promoting electron conduction, such as a protrusion of the linear conductor 12, a damage (notch) of the partition wall of the plate-like body 11, or collapse of the linear conductor 12, exist on the surface of the plate-like body 11. In addition, there may also be the case where a foreign matter 500, such as a stain or a fine particle, attaches onto the surface of the plate-like body 11.

In the route R2, an electron conducts in the partition wall of the plate-like body 11, whereas in the route R3, an electron conducts on the surface of the partition wall of the plate-like body 11 corresponding to the same thickness (interface between the plate-like body 11 and the insulating layer 30). The surface conduction is sensitive to the surface state, and because of an influence by the defects of the surface shown in the part C or attachment of the foreign matter 50X), the surface conduction is liable to occur. In this way, the presence of the defect or foreign matter on the surface of the plate-like body 11 becomes the starting point of causing the electron conduction in the route R3, thereby lowering the insulation reliability between the wiring layers 20.

Namely, as compared with the routes R1 and R2, the route R3 is a main cause of lowering the insulation reliability between the wiring layers 20. Accordingly, with respect to the route R3, it is useful to consider a countermeasure against suppression of the insulation reliability. It is to be noted that while the wiring layer 20 has been explained, the same is also applicable to the wiring layer 120.

Figure 5A:
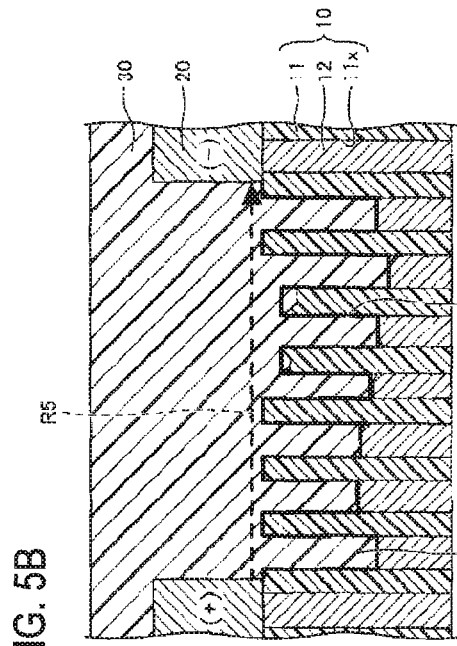
FIGS. 5A to 5D are views explaining insulation reliability of the wiring substrate according to the first embodiment of the present invention (part 1).
Figure 5B:
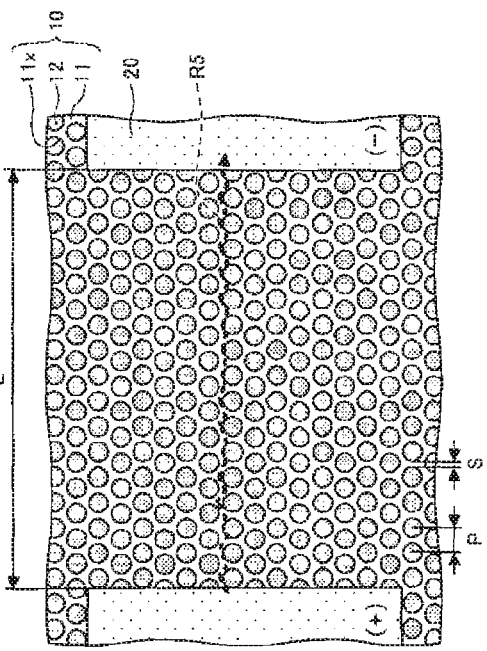
Figure 5C:
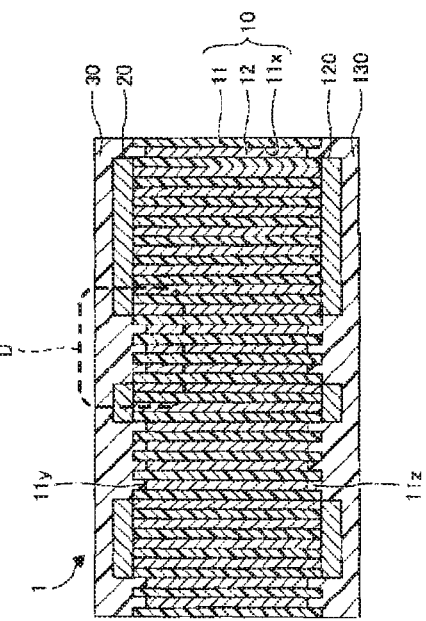
Figure 5D:
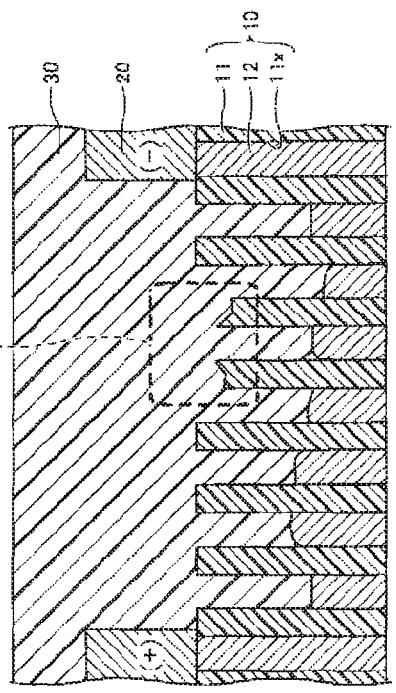
Figure 6:
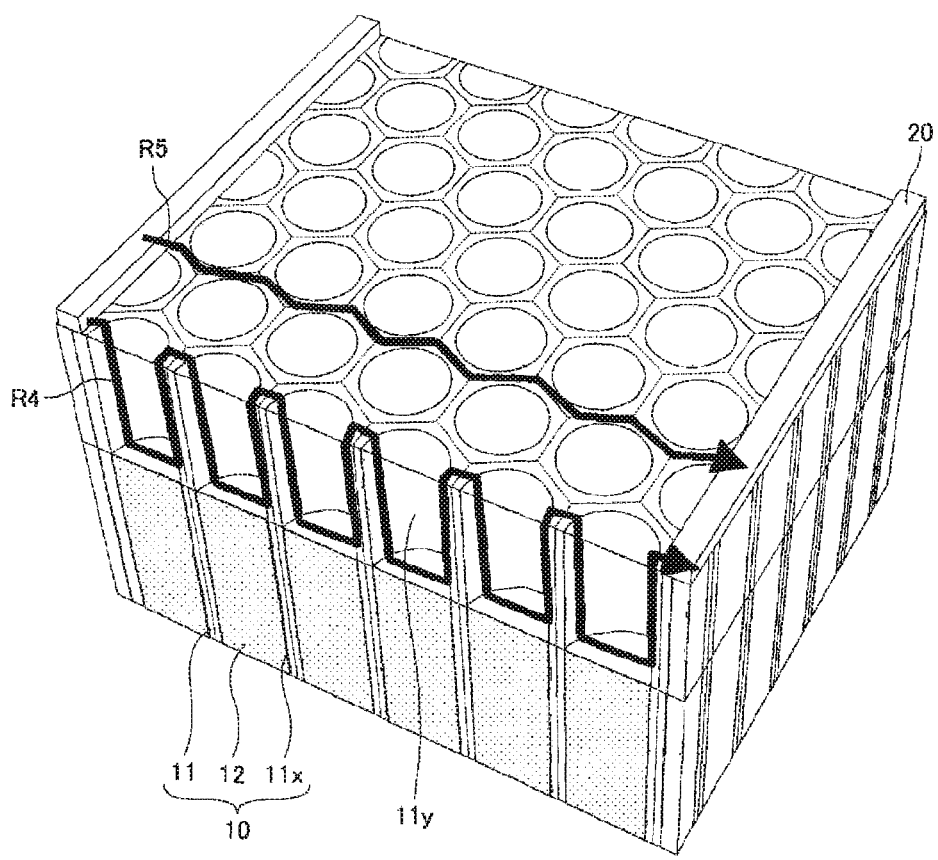
FIG. 6 is a view explaining insulation reliability of the wiring substrate according to the first embodiment of the present invention (part 2).

In the wiring substrate 1, the current flowing in the route R3 is suppressed. FIGS. 5A to 5D and FIG. 6 are views explaining the insulation reliability of the wiring substrate according to the first embodiment. FIG. 5A is a cross-sectional view illustrating the wiring substrate 1 according to the first embodiment, and FIGS. 5B and 5C are each an enlarged view of a part D of FIG. 5A. In addition, FIG. 5D is a plan view of the part D. However, in FIG. 5D, the insulating layer 30 is not illustrated. In addition. FIG. 6 is a perspective view of FIG. 5B.

The wiring substrate 1 has the holes 11y and 11z, in which the insulating layers 30 and 130 are filled, respectively. In addition, a depression amount (depth) of each of the holes 11y and 11z is about several ten nm to several μm, a value of which is a radius of the linear conductor 12 (about 25 nm to 1 μm) or more. For that reason, the upper end surface and the lower end surface of the linear conductor 12 as transfer points of the surface conduction are positioned in the partition wall of the plate-like body 11 (bottom surfaces of the holes 11y and 11x).

In this structure, two of a route R4 and a route R5 shown in FIG. 5B and FIG. 6 may be thought as a route corresponding to the route R3 of the wiring substrate 1X. The route R4 is a route going along an inner wall surface of the hole 11y and conducting via the upper end surface of the linear conductor 12 (bottom surface of the hole 11y). The route 5 is a route conducting in a region where the linear conductor 12 of the surface of the plate-like body 11 does not exist.

Since the route R4 goes along the inner wall surface of the hole 11y, a distance at which an electron conducts on the surface of the plate-like body 11 as the insulator is increased as compared with the route R3 of the wiring substrate 1X. In addition, in the case where the depth of the hole 11y is the radius of the linear conductor 12 or more, the route R5 is shorter than the route R4 in terms of a route conducting in the plate-like body 11 as the insulator. For that reason, an electron does not conduct in the route R4 but conducts in the route R5.

In the route R5, a distance at which an electron conducts on the surface of the plate-like body 11 as the insulator becomes equal to the distance L between the wiring layers 20 even at the shortest. As described above, it is assumed that the gap L of the wiring layers 20 is 10 μm, the pitch P of the linear conductors 12 is 100 nm, and the thickness S of the partition wall of the plate-like body 11 (gap of the linear conductors 12) is 30 nm. In this case, a distance at which an electron conducts in the route R5 is 10 μm, a value of which is increased 3 times or more as compared with the case of the route R3 (3 μm) of the wiring substrate 1X. It is to be noted that while the wiring layer 20 has been explained, the same is also applicable to the wiring layer 120. According to these, in the route R5, the electron conduction is hardly generated as compared with the route R3. As a result, in the wiring substrate 1, the withstand voltage between the wiring layers 20 is significantly improved as compared with the wiring substrate 1X, and the insulating reliability is enhanced.

In addition, as described above, as shown in FIG. 4C, the wiring substrate 1X has a non-uniform structure in which a portion liable to cause a short circuit, such as a portion where the linear conductor 12 is locally protruded from the surface of the plate-like body 11, exists. In contrast, in the wiring substrate 1, the upper end surface and the lower end surface of the linear conductor 12 are made more depressed than the surface of the plate-like body 11. For that reason, as in a part E of FIG. 5C, even if a damage of the partition wall of the plate-like body 11 exists, the linear conductor 12 protruded from the surface of the plate-like body 11 does not exist, thereby having a uniform structure.

Namely, in the wiring substrate 1, a portion liable to locally cause a short circuit as in the wiring substrate 1X does not exist.

Enhancement of Connection Reliability

FIGS. 7A to 7D are views explaining the connection reliability of a wiring substrate according to Comparative Example and illustrate a part of manufacturing processes of a wiring substrate 1Y according to Comparative Example.

Figure 7A:
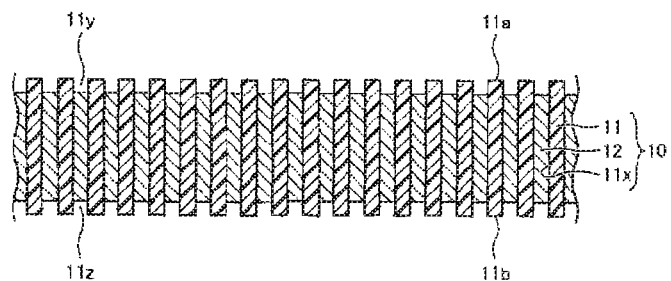
FIGS. 7A to 7D are views explaining connection reliability of a wiring substrate according to Comparative Example.

In the manufacturing processes of the wiring substrate 1Y, first of all, as shown in FIG. 7A, the upper end surface of the linear conductor 12 is selectively etched relative to the one surface 11a of the plate-like body 11 in the entire region of the core layer 10. In addition, the lower end surface of the linear conductor 12 is selectively etched relative to the other surface 11b of the plate-like body 11 in the entire region of the core layer 10. According to this, in the entire region of the core layer 10, the hole 11y is formed by the inner wall surface of the through-hole 11x and the upper end surface of the linear conductor 12, and the hole 11z is formed by the inner wall surface of the through-hole 11x and the lower end surface of the linear conductor 12.

Figure 7B:
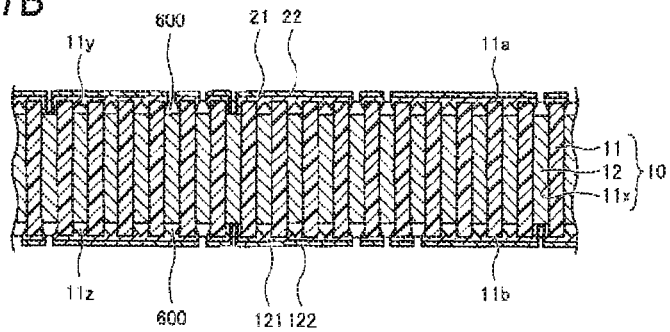

Then, as shown in FIG. 7B, the metal layers 21 and 22 are successively provided on the one surface 11a of the plate-like body 11 by, for example, a sputtering process. In addition, the metal layers 121 and 122 are successively provided on the other surface 11b of the plate-like body 11 by, for example, a sputtering process.

Here, since a diameter of the hole 11y is very small as about 50 nm to 2 μm, it is difficult to form the metal layers 21 and 22 with good coatability in the hole 11y by a sputtering method. For that reason, a problem, such as the formation of a void 600 in the hole 11y, is caused. In a portion where the void 600 is formed, the metal layers 21 and 22 do not come into contact with the upper end surface of the linear conductor 12, and hence, the connection reliability is lowered. The same is also applicable to the hole 11z.

Figure 7C:
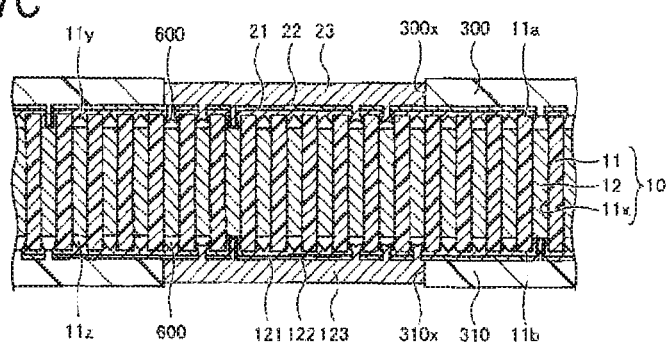

Then, as shown in FIG. 7C, after the resist layer 300 provided with the opening 300x corresponding to the wiring layer 20 is formed on the metal layer 22, the metal layer 23 made of copper (Cu) or the like is formed in the opening 300x of the resist layer 300 by an electroplating process using the metal layer 22 as a power supply layer. In addition, after the resist layer 310 provided with the opening 310x corresponding to the wiring layer 120 is formed on the metal layer 122, the metal layer 123 made of copper (Cu) or the like is formed in the opening 310x of the resist layer 310 by an electroplating process using the metal layer 122 as a power supply layer.

Figure 7D:
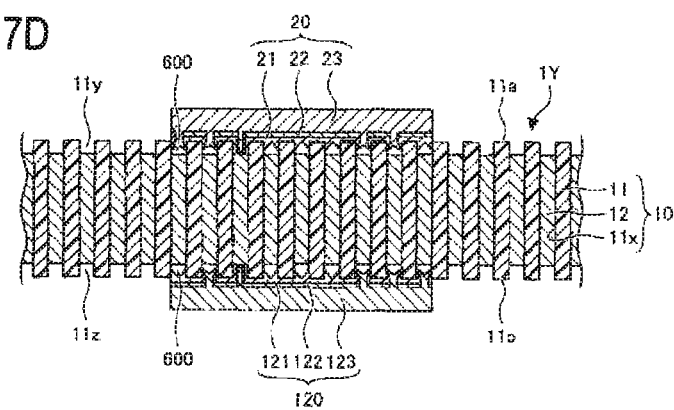

Then, as shown in FIG. 7D, after removing the resist layer 300 shown in FIG. 7C, the metal layer 23 is masked, and the metal layers 21 and 22 not covered by the metal layer 23 are removed by etching. In addition, after removing the resist layer 310 shown in FIG. 7C, the metal layer 123 is masked, and the metal layers 121 and 122 not covered by the metal layer 123 are removed by etching. According to this, the wiring layer 20 in which the metal layer 21, the metal layer 22, and the metal layer 23 are successively provided is formed on the one surface 11a of the plate-like body 11. In addition, the wiring layer 120 in which the metal layer 121, the metal layer 122, and the metal layer 123 are successively provided is formed on the other surface 11b of the plate-like body 11.

Now, as described above, in a process of FIG. 7B, a portion where the metal layers 21 and 22 do not come into contact with the upper end surface of the linear conductor 12 is generated due to the presence of the void 600. In addition, a portion where the metal layers 121 and 122 do not come into contact with the lower end surface of the linear conductor 12 is generated due to the presence of the void 600. In such a portion, on the occasion of forming the metal layers 23 and 123 by an electroplating process in the process of FIG. 7C, an electric power cannot be supplied, and hence, the metal layers 23 and 123 do not come into contact with the linear conductor 12, too.

In addition, even in the case where in the process of FIG. 7B, the metal layers 21 and 22 confine the void 600 in the opening portion of the hole 11y and are formed like a cover, the electrolytic solution does not enter the inside of the hole 11y in the process of FIG. 7C, and hence, the metal layer 23 does not come into contact with the linear conductor 12. The same is also applicable to the metal layer 123.

For that reason, in the process of FIG. 7D, the wiring layer 20 is in such a state where it comes into contact with only a part of the plural linear conductors 12 (portion where the void 600 is not formed), the connection reliability between the wiring layer 20 and the linear conductor 12 is lowered. This problem is liable to occur as the holes 11y and 11z are made deeper (higher in terms of an aspect ratio). Namely, as the holes 11y and 11z are made deeper for the purpose of enhancing the above-described insulation reliability, the connection reliability between the wiring layers 20 and 120 and the linear conductor 12 is lowered. Therefore, in the related-art wiring substrate 1Y, it was difficult to make both an enhancement of the insulation reliability and an enhancement of the connection reliability compatible with each other. The same is also applicable to the wiring layer 120.

In contrast, as shown in FIG. 2B, in the wiring substrate 1, at a point of time of forming the metal layers 21 and 22 and 121 and 122, the one surface 11a and the other surface 11b of the plate-like body 11 are a flat surface. For that reason, the metal layers 21 and 22 may be easily formed on the one surface 11a of the plate-like body 11 by a sputtering process, and the metal layers 121 and 122 may be easily formed on the other surface 11b of the plate-like body 11 by a sputtering process.

Namely, in the wiring substrate 1, a void is not generated between the metal layers 21 and 22, or the metal layers 121 and 122, and the linear conductor 12, the metal layers 21 and 22, or the metal layers 121 and 122, and the linear conductor 12 are connected to each other in a state with high reliability. As a result, on the occasion of forming the metal layers 23 and 123 by an electroplating process, the metal layer 23 is also connected onto the metal layers 21 and 22 in a state with high reliability without causing the problem of power supply as in the wiring substrate 1Y. In addition, the metal layer 123 is connected onto the metal layers 121 and 122 in a state with high reliability. Namely, the connection reliability between the wiring layers 20 and 120 and the linear conductor 12 may be more enhanced than that in the wiring substrate 1Y.

In addition, in the wiring substrate 1Y, the resist layers 300 and 310 are subjected to patterning on the concave and convex metal layers 22 and 122 in the process of FIG. 7C. In contrast, in the wiring substrate 1, the resist layers 300 and 310 are subjected to patterning on the flat metal layers 22 and 122 in the process of FIG. 2C. For that reason, as compared with the wiring substrate 1Y, the wiring substrate 1 is able to form a fine pattern and also to reduce residues of the resist layers 300 and 310 after the development.

In addition, in the wiring substrate 1Y, the metal layers 21 and 22 are also formed in the hole 11y, and the metal layers 121 and 122 are also formed in the hole 11z in the process of FIG. 7B. For that reason, in the process of FIG. 7D, on the occasion of removing the unnecessary metal layers 21 and 22 by etching, it takes a considerable time to remove the metal layers 21 and 22 formed in the hole 11y. Similarly, on the occasion of removing the unnecessary metal layers 121 and 122 by etching, it takes a considerable time to remove the metal layers 121 and 122 formed in the hole 11z. In addition, it is difficult to completely remove metal residues in the holes 11y and 11z. In contrast, in the wiring substrate 1, the metal layers 21 and 22 and the metal layers 121 and 122 are respectively formed on the one surface 11a and the other surface 11b of the flat plate-like body 11 in the process of FIG. 2B. For that reason, at the time of removing the unnecessary metal layers 21 and 22 and metal layers 121 and 122 in the processes of FIGS. 3A and 3B, these unnecessary metal layers may be removed for a short period of time without leaving residues.

In particular, in the case where the metal layers 21 and 121 are a layer containing titanium (Ti), and the layers containing titanium (Ti) are wet etched with hydrofluoric acid or the like in the process of FIG. 3B, a matrix (anodically oxidized film of aluminum) of the plate-like body 11 is also melted together with titanium (Ti). For that reason, in the wiring substrate 1, it is possible to remove titanium (Ti) for a short period of time, and a damage which the plate-like body 11 receives may be reduced.

Modified Example of First Embodiment

In a modified example of the first embodiment, an example of a wiring substrate in which an insulating layer or a wiring layer is further provided on the both surfaces of the wiring substrate according to the first embodiment is shown. It is to be noted that in the modified example of the first embodiment, with respect to the same constituent portions as those described already, there may be the case where their explanations are omitted.

FIGS. 8A to 8B are cross-sectional views illustrating the wiring substrate according to the modified example of the first embodiment, and FIG. 8B is an enlarged view of a part F of FIG. 8A. Reference is made to FIGS. 8A and 8B. A wiring substrate 2 has a structure in which a wiring layer 40, an insulating layer 50, and a wiring layer 60 are further provided on the side of the one surface 11a of the plate-like body 11 of the wiring substrate 1, and a wiring layer 140, an insulating layer 150, and a wiring layer 160 are further provided on the side of the other surface 11b.

The wiring layer 40 is provided on the insulating layer 30. The wiring layer 40 is configured to include a via wiring filled in an opening 30x (via hole) penetrating through the insulating layer 30 and exposing the upper surface of the wiring layer 20 and a wiring pattern formed on the upper surface of the insulating layer 30. The wiring layer 140 is provided on the insulating layer 130. The wiring layer 140 is configured to include a via wiring filled in an opening 130x (via hole) penetrating through the insulating layer 130 and exposing the lower surface of the wiring layer 120 and a wiring pattern formed on the lower surface of the insulating layer 130. As a material of each of the wiring layers 40 and 140, for example, copper (Cu) or the like may be used. A thickness of the wiring pattern constituting each of the wiring layers 40 and 140 may be, for example, about 1 to 10 µm.

The insulating layer 50 is formed on the insulating layer 30 and covers the wiring layer 40. The insulating layer 50 has an opening 50x, and a part of the upper surface of the wiring layer 40 is exposed in the opening 50x. The insulating layer 150 is formed on the insulating layer 130 and covers the wiring layer 140. The insulating layer 150 has an opening 150x, and a part of the lower surface of the wiring layer 140 is exposed in the opening 150x. As a material of each of the insulating layers 50 and 150, for example, an insulating resin containing, as a main component, an epoxy-based resin or a phenol-based resin, or the like may be used. Each of the insulating layers 50 and 150 may contain a filler, such as silica ($SiO_2$). In addition, each of the insulating layers 50 and 150 may have thermosetting or photosensitive properties. A thickness of each of the insulating layers 50 and 150 may be, for example, about 3 to 30 µm.

The wiring layer 60 is provided on the insulating layer 50. The wiring layer 60 is configured to include a via wiring filled in an opening 50x (via hole) penetrating through the insulating layer 50 and exposing the upper surface of the wiring layer 40 and a wiring pattern formed on the upper surface of the insulating layer 50. The wiring layer 160 is provided on the insulating layer 150. The wiring layer 160 is configured to include a via wiring filled in an opening 150x (via hole) penetrating through the insulating layer 150 and exposing the lower surface of the wiring layer 140 and a wiring pattern formed on the lower surface of the insulating layer 150. As a material of each of the wiring layers 60 and 160, for example, copper (Cu) or the like may be used. A thickness of the wiring pattern constituting each of the wiring layers 60 and 160 may be, for example, about 1 to 10 μm.

Each of the wiring layers 60 and 160 functions as a pad to be electrically connected to a semiconductor chip or the like. If desired, the above-described metal layer may be formed on each of the upper surface of the wiring layer 60 and the lower surface of the wiring layer 160, or each of the wiring layers 60 and 160 may be subjected to an anti-oxidation treatment, such as an OSP treatment. In addition, an external connection terminal, such as a solder ball, may be formed on the upper surface of the wiring layer 60 or the lower surface of the wiring layer 160.

It is to be noted that each of the wiring layers 40 and 60 and 140 and 160 may be formed by adopting various wiring forming methods, such as a semi-additive process or a subtractive process. In additive, each of the insulating layers 50 and 150 may be formed by the same method as in the insulating layer 30.

In this way, a multi-layered wiring layer may be formed on each of the one surface 11a and the other surface 11b of the plate-like body 11. It is to be noted that the number of wiring layers and insulating layers to be provided on each of the surfaces may be properly determined as the need arises.

Second Embodiment

In a second embodiment of the present invention, an example of a semiconductor package in which a semiconductor chip is mounted on the wiring substrate according to the modified example of the first embodiment is illustrated. It is to be noted that in the second embodiment, with respect to the same constituent portions as those in the embodiments described already, there may be the case where their explanations are omitted.

Figure 9:
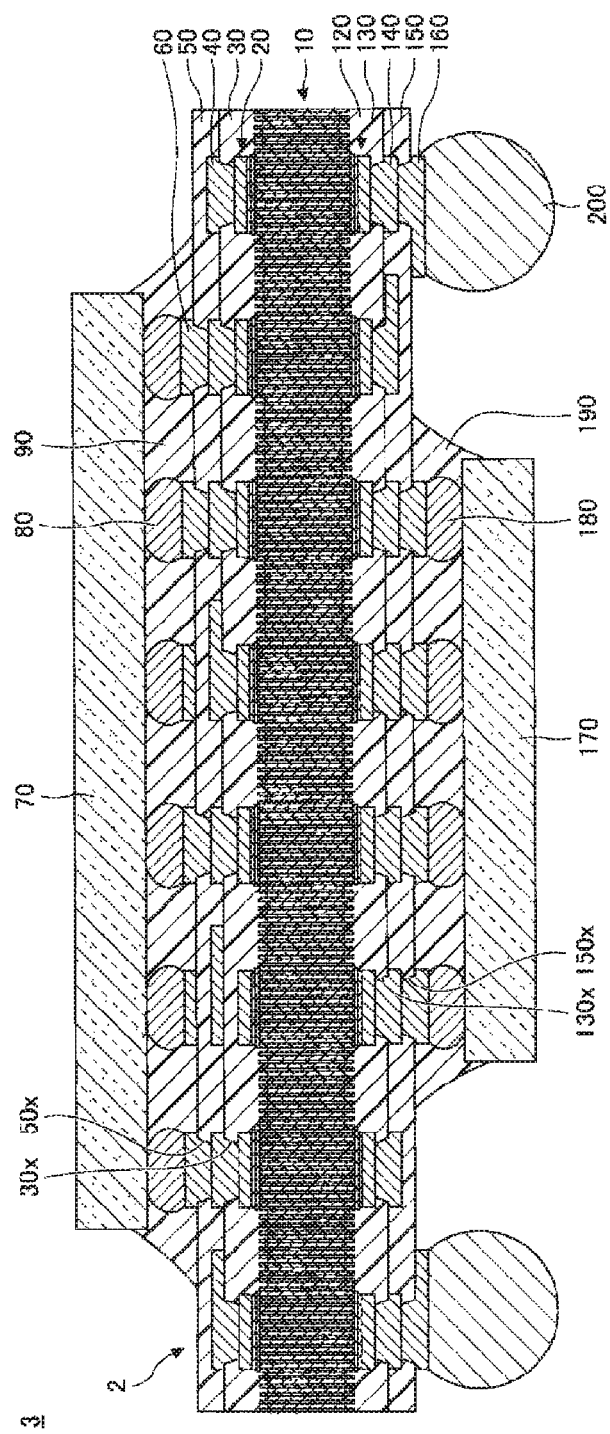
FIG. 9 is a cross-sectional view illustrating a semiconductor package according to a second embodiment of the present invention.

FIG. 9 is a cross-sectional view illustrating the semiconductor package according to the second embodiment. Reference is made to FIG. 9. A semiconductor passage 3 has the wiring substrate 2, semiconductor chips 70 and 170, bumps 80 and 180, underfill resins 90 and 190, and an external connection terminal 200.

The semiconductor chip 70 is mounted on the side of the one surface 11a of the plate-like body 11 of the wiring substrate 2, and an electrode pad (not illustrated) of the semiconductor chip 70 is electrically connected to the wiring layer 60 of the wiring substrate 2 via the bump 80. The underfill resin 90 is filled between the semiconductor chip 70 and the insulating layer 50 of the wiring substrate 2.

The semiconductor chip 170 is mounted on the side of the other surface 11b of the plate-like body 11 of the wiring substrate 2, and an electrode pad (not illustrated) of the semiconductor chip 170 is electrically connected to the wiring layer 160 disposed on the central side of the wiring substrate 2 via the bump 180. The underfill resin 190 is filled between the semiconductor chip 170 and the insulating layer 150 of the wiring substrate 2. The external connection terminal 200 is formed in the wiring layer 160 disposed on the outer peripheral side of the wiring substrate 2.

As the bumps 80 and 180 and the external connection terminal 200, for example, a solder ball or the like may be used. As a material of the solder ball, for example, an alloy containing Pb, an alloy of Sn and Cu, an alloy of Sn and Sb, an alloy of Sn and Ag, an alloy of Sn, Ag, and Cu, or the like may be used.

In this way, the semiconductor package 3 having the semiconductor chips 70 and 170 mounded on the wiring substrate 2 may be realized. It is to be noted that the semiconductor chips 70 and 170 may have a same shape as or a different shape from each other. In addition, the semiconductor chips 70 and 170 may have a same function as or a different function from each other. In addition, plural semiconductor chips may be mounted on the one side or the other side or the both sides of the wiring substrate 2. In addition, the semiconductor chip may be mounted on only the one side of the wiring substrate 2. In addition, the wiring substrate 1 may be used in place of the wiring substrate 2.

The present invention has been described in detail with reference to the preferred embodiments and modified examples thereof. However, it should be construed that the present invention is not limited to foregoing embodiments and modified examples thereof, and various modifications and substitutions can be applied to the foregoing embodiments and modified examples thereof without departing from the scope described in the claims.

Clauses

This disclosure further encompasses various exemplary embodiments, for example, described below.

1. A method for manufacturing a wiring substrate, comprising:
preparing a core layer including a plate-like body and a plurality of linear conductors penetrating through the plate-like body in a thickness direction, a gap between the adjacent linear conductors being smaller than a diameter of each of the linear conductors:
selectively forming a first wiring layer on a first surface of the plate-like body;
not etching a first linear conductor disposed in a position overlapping with the first wiring layer in planar view and conducting to the first wiring layer but etching an end surface of a second linear conductor disposed in a position not overlapping with the first wiring layer in planar view on the side of the first surface, thereby making it more depressed than the first surface, and forming a hole between an end surface of the second linear conductor on the side of the first surface and the first surface; and
forming an insulating layer on the first surface, the insulating layer covering the first wiring layer and filling the hole.

2. The method for manufacturing a wiring substrate according to claim 1, wherein the selectively forming the first wiring layer includes
forming a lower metal layer on the first surface,
selectively providing an upper metal layer made of a metal different from the lower metal layer on the lower metal layer, and
removing the lower-metal layer not covered by the upper metal layer, thereby forming the first wiring layer including the lower metal layer and the upper metal layer.

3. The method for manufacturing a wiring substrate according to claim 2, wherein in the forming the hole, a surface of the upper metal layer is etched, and in planar view, an outer peripheral part of the lower metal layer is exposed to a region surrounding the upper metal layer.

4. The method for manufacturing a wiring substrate according to any one of claims 1 to 3, comprising:
forming a second wiring layer to be connected to the first wiring layer via the first linear conductor on a second surface of the plate-like body, wherein
in the forming the hole, the end surface of the second linear conductor on the side of the first surface is etched to form the hole, an end surface of the second linear conductor on the side of the second surface is etched, thereby making it more depressed than the second surface, and a second hole is formed between the end surface of the second linear conductor on the side of the second surface and the second surface, and in the forming the insulating layer, the insulating layer covering the first wiring layer and filling the hole therein is formed on the first surface, and a second insulating layer covering the second wiring layer and filling the second hole therein is formed on the second layer.

5. The method for manufacturing a wiring substrate according to any one of claims 1 to 4, comprising:

forming other wiring layer electrically connecting to the first wiring layer on the insulating layer.

What is claimed is:

1. A wiring substrate comprising:

a core layer including a plate-like body and a plurality of linear conductors penetrating through the plate-like body in a thickness direction;

a first wiring layer formed selectively on a first surface of the plate-like body; and an insulating layer formed on the first surface and covering the first wiring layer, wherein a gap between the adjacent linear conductors is smaller than a diameter of each of the linear conductors, the plurality of linear conductors include a first linear conductor disposed in a position overlapping with the first wiring layer in planar view and conducting to the first wiring layer and a second linear conductor disposed in a position not overlapping with the first wiring layer in planar view, an end surface of the first linear conductor on the side of the first surface is approximately flush with the first surface, an end surface of the second linear conductor on the side of the first surface is in a position more depressed than the first surface, and a hole is formed between the end surface of the second linear conductor on the side of the first surface and the first surface, and the insulating layer is filled in the hole.

2. The wiring substrate according to claim 1, wherein the first wiring layer includes a lower metal layer formed on the side of the core layer and an upper metal layer provided on the lower metal layer, and in planar view, an outer peripheral part of the lower metal layer is exposed to a region surrounding the upper metal layer.

3. The wiring substrate according to claim 1 comprising:

a second wiring layer formed on a second surface of the plate-like body, and a second insulating layer formed on the second surface and covering the second wiring layer, wherein the second wiring layer is connected to the first wiring layer via the first linear conductor, an end surface of the first linear conductor on the side of the second surface is approximately flush with the second surface, an end surface of the second linear conductor on the side of the second surface is in a position more depressed than the second surface, and a second hole is formed between the end surface of the second linear conductor on the side of the second surface and the second surface, and the second insulating layer is filled in the second hole.

4. The wiring substrate according to claim 1, further comprising:

other wiring layer formed on the insulating layer and electrically connecting to the first wiring layer.

5. A semiconductor package comprising:

the wiring substrate according to claim 1; and a semiconductor chip electrically connecting to the first wiring layer of the wiring substrate.

* * * * *